(12) United States Patent
Ito et al.

(10) Patent No.: US 7,420,404 B2
(45) Date of Patent: Sep. 2, 2008

(54) PHASE ADJUSTER CIRCUIT AND PHASE ADJUSTING METHOD

(75) Inventors: Shoko Ito, Kasugai (JP); Kazunori Nishizono, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/447,852

(22) Filed: Jun. 7, 2006

(65) Prior Publication Data

US 2007/0188209 A1   Aug. 16, 2007

(30) Foreign Application Priority Data

Feb. 10, 2006   (JP) .............................. 2006-034150

(51) Int. Cl.
*H03K 5/13* (2006.01)

(52) U.S. Cl. .................. 327/231; 327/237; 327/243

(58) Field of Classification Search ........... 327/231–33, 327/236–238, 240, 243, 244, 254, 255
See application file for complete search history.

(56) References Cited

FOREIGN PATENT DOCUMENTS

| JP | 60-194820 | 10/1985 |
|----|-----------|---------|
| JP | 04-168803 | 6/1992 |
| JP | 04-267620 | 9/1992 |
| JP | 05161029 A * | 6/1993 |
| JP | 10-031032 | 2/1998 |

* cited by examiner

*Primary Examiner*—N. Drew Richards
*Assistant Examiner*—Patrick O'Neill
(74) *Attorney, Agent, or Firm*—Arent Fox LLP

(57) ABSTRACT

A phase adjustor circuit and a phase adjusting method are capable of preventing a phase shift amount from fluctuating even if a frequency of a transmission carrier wave of a sensor signal fluctuates. A chopping wave converter circuit converts a pulse string signal into a chopping wave. A chopping wave amplitude control circuit compares the amplitude value of the chopping wave with an amplitude reference value and outputs an adjustment signal corresponding to a difference between those values to the chopping wave converter circuit. The chopping wave converter circuit changes a slope of the chopping wave according to the adjustment signal to adjust the amplitude value of the chopping wave. As a result, a feedback group is structured, and the amplitude value of the chopping wave is maintained to a constant value according to the amplitude reference value.

16 Claims, 12 Drawing Sheets

PRINCIPLE OF PRESENT INVENTION

FIG.2 CIRCUIT DIAGRAM OF SYNCHRONOUS DETECTION CIRCUIT 10 ACCORDING TO FIRST EMBODIMENT

TIMING CHART OF SYNCHRONOUS DETECTION CIRCUIT 10 (PART 1)

TIMING CHART OF SYNCHRONOUS DETECTION CIRCUIT 10 (PART 2)

FIG.5 TIMING CHART OF SYNCHRONOUS DETECTION CIRCUIT 10 (PART 3)

FIG.6 CIRCUIT DIAGRAM OF PHASE ADJUSTER CIRCUIT 1a ACCORDING TO SECOND EMBODIMENT

TIMING CHART OF PHASE ADJUSTER CIRCUIT 1b ACCORDING TO THIRD EMBODIMENT

TIMING CHART OF PHASE ADJUSTER CIRCUIT 1c

CIRCUIT DIAGRAM OF CHOPPING WAVE AMPLITUDE CONTROL CIRCUIT 3c

CIRCUIT DIAGRAM OF SYNCHRONOUS DETECTION CIRCUIT 100 ACCORDING TO RELATED ART

PHASE ADJUSTER CIRCUIT AND PHASE ADJUSTING METHOD

CROSS-REFERENCE TO RELATED APPLICATIONS

This application is based upon and claims the benefit of priority from each of the prior Japanese Patent Application No. 2006-034150 filed on Feb. 10, 2006, the entire contents of which are incorporated herein by reference.

BACKGROUND OF THE INVENTION

1. Field of the Invention

The present invention relates to a phase adjuster circuit and a phase adjusting method, and more particularly to accurate phase adjustment of a reference signal used for minute signal amplification.

2. Description of Related Art

There is a method using synchronous detection as means for amplifying a minute signal that is obtained from a sensor 111. FIG. 13 shows a synchronous detection circuit 100 according to a related art. A carrier wave RS is outputted from an oscillator 112 as a transmission carrier wave of a sensor signal. In the sensor 111, the carrier wave RS is subjected to amplitude modulation. A signal that has been subjected to amplitude modulation is amplified by an amplifier 116, and then inputted to a synchronous detection circuit 115. Also, in a phase adjuster circuit 101, a phase of the carrier wave RS is shifted. In general, the phase of the carrier wave RS is shifted by 90°. Also, as the phase adjuster circuit 101, there is used a differentiation circuit using a capacitor and a resistant element, or a delay circuit. Synchronous detection is conducted in the synchronous detection circuit 115. A detection signal DS that is outputted from the synchronous detection circuit 115 is inputted to a low pass filter 113. A demodulation signal DTS is outputted from the low pass filter 113 and then inputted to an amplifier 117. An output signal VOUT is outputted from the amplifier 117. With the above structure, only an original signal component of the sensor 111 is detected.

The above related art is disclosed in Japanese Unexamined Patent Publication No. H04(1992)-267620, Japanese Unexamined Patent Publication No. H10(1998)-31032, Japanese Unexamined Patent Publication No. S60(1985)-194820, and Japanese Unexamined Patent Publication No. H04(1992)-168803.

SUMMARY OF THE INVENTION

However, a frequency fr of the carrier wave RS that is outputted from the oscillator 112 may fluctuate with a temperature change or a secular change. This leads to a problem that, in the conventional phase adjuster circuit 101, the amount of phase adjustment of the carrier wave RS may be deviated from a desired value according to the fluctuation of the frequency fr.

Also, in the amount of phase adjustment, fine adjustment is required according to the sensitivity of the sensor 111. However, when the amount of phase adjustment changes according to the fluctuation of the frequency fr, fine adjustment becomes difficult, which is a problem. Also, the differentiation circuit or the delay circuit suffers from a problem that it is difficult to finely adjust the amount of phase deviation from the structural viewpoint.

The present invention has been made to solve at least one of the problems with the related art, and therefore an object of the present invention is to provide a shift adjuster circuit and a shift adjusting method, which are capable of preventing the amount of phase shift from fluctuating and is also capable of surely finely adjusting the phase even in the case where a frequency of a transmission carrier wave of a sensor signal fluctuates.

To solve the above problem, there is provided a phase adjuster circuit in minute signal amplification using a reference signal and a phase shift reference signal having a given phase difference with respect to the reference signal, comprising: a chopping wave converter circuit that converts the reference signal into a chopping wave; a chopping wave amplitude control circuit to which the chopping wave is inputted and which outputs an adjustment signal corresponding to a difference of the amplitude value of the chopping wave with respect to the amplitude reference value to the chopping wave converter circuit; and a phase shift circuit that compares the inputted chopping wave with a given threshold value to output the phase shift reference signal, wherein the chopping wave converter circuit adjusts the amplitude value according to the adjustment signal.

Also, to solve the above problem, a phase adjusting method in minute signal amplification using a reference signal and a phase shift reference signal having a given phase difference with respect to the reference signal, comprises the steps of: converting the reference signal into a chopping wave; acquiring an adjustment signal according to a difference of the amplitude value of the chopping wave with respect to an amplitude reference value; and comparing the inputted chopping wave with a given threshold value to output the phase shift reference signal, wherein the amplitude value is adjusted according to the adjustment signal when the reference signal is converted into the chopping wave.

The chopping wave converter circuit or the step of converting into the chopping wave converts a reference signal into the chopping wave. The reference signal is, for example, carrier waves that are comprised of a predetermined frequency pulse string. The chopping wave amplitude control circuit receives the chopping wave that has been converted, and compares the amplitude value of the chopping wave with an amplitude reference value. In this example, the amplitude reference value is a predetermined value that is the basis of determination of the amplitude value of the chopping wave. For example, an average value of the amplitude values of the chopping waves, a peak value of the amplitude, and a bottom value of the amplitude are used as the amplitude reference value. Then, the chopping wave amplitude control circuit outputs an adjustment signal to the chopping wave converter circuit according to a difference between the amplitude reference value and the amplitude value of the chopping wave. Also, the step of acquiring the adjustment signal acquires the adjustment signal according to the difference between the amplitude value of the chopping wave and the amplitude reference value. The chopping wave converter circuit adjusts the amplitude value of the chopping wave so as to reduce the difference between the amplitude reference value and the amplitude value according to the adjustment signal. Also, the step of converting into the chopping wave adjusts the amplitude value according to the adjustment signal when converting the reference signal into the chopping wave. With the above configuration, a feedback control is conducted, and the amplitude value of the chopping wave is maintained at a constant value according to the amplitude reference value. Therefore, for example, even in the case where there occurs a disturbance that allows the frequency of the reference signal to be shifted, the amplitude value of the chopping wave can be maintained at the constant value.

The phase shift circuit or the step of outputting the phase reference signal compares the inputted chopping wave with a given threshold value. In this example, the threshold value is a value for determining the amount of phase shift of the phase reference signal with respect to the reference signal, which is a predetermined value. When the chopping wave is binaried by using the threshold value, a phase reference signal that is a pulse string signal whose phase has been shifted with respect to the original reference signal is obtained. In this situation, the amount of phase shift is determined according to a relative potential relationship of the threshold value in a voltage range of the amplitude value. Then, because a slope of the chopping wave is constant, the amount of change of the threshold value and the amount of phase shift has a proportional relationship. The phase reference signal obtained by the phase shift circuit or the step of outputting the phase reference signal is used for the minute signal amplification of the synchronous detection or the delay detection together with the reference signal.

As described above, in the phase adjuster circuit or the phase adjusting method according to the present invention, the amplitude of the chopping wave is maintained to a constant value that is determined according to the amplitude reference value under the feedback control. Therefore, even in the case where the frequency of the reference signal fluctuates, the amount of phase shift of the phase reference signal with respect to the reference signal can be maintained to the constant value. As a result, the stable minute signal amplifying operation can be conducted.

Also, the amount of phase shift is determined according to the chopping wave, thereby making it possible to provide the proportional relationship between the amount of change of the threshold value and the amount of phase shift. As a result, the amount of phase shift can be readily finely adjusted. Also, the amount of phase shift is determined according to the current, thereby making it possible to simply adjust the amount of phase shift as compared with a case in which the capacitance or the resistance value is variable.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
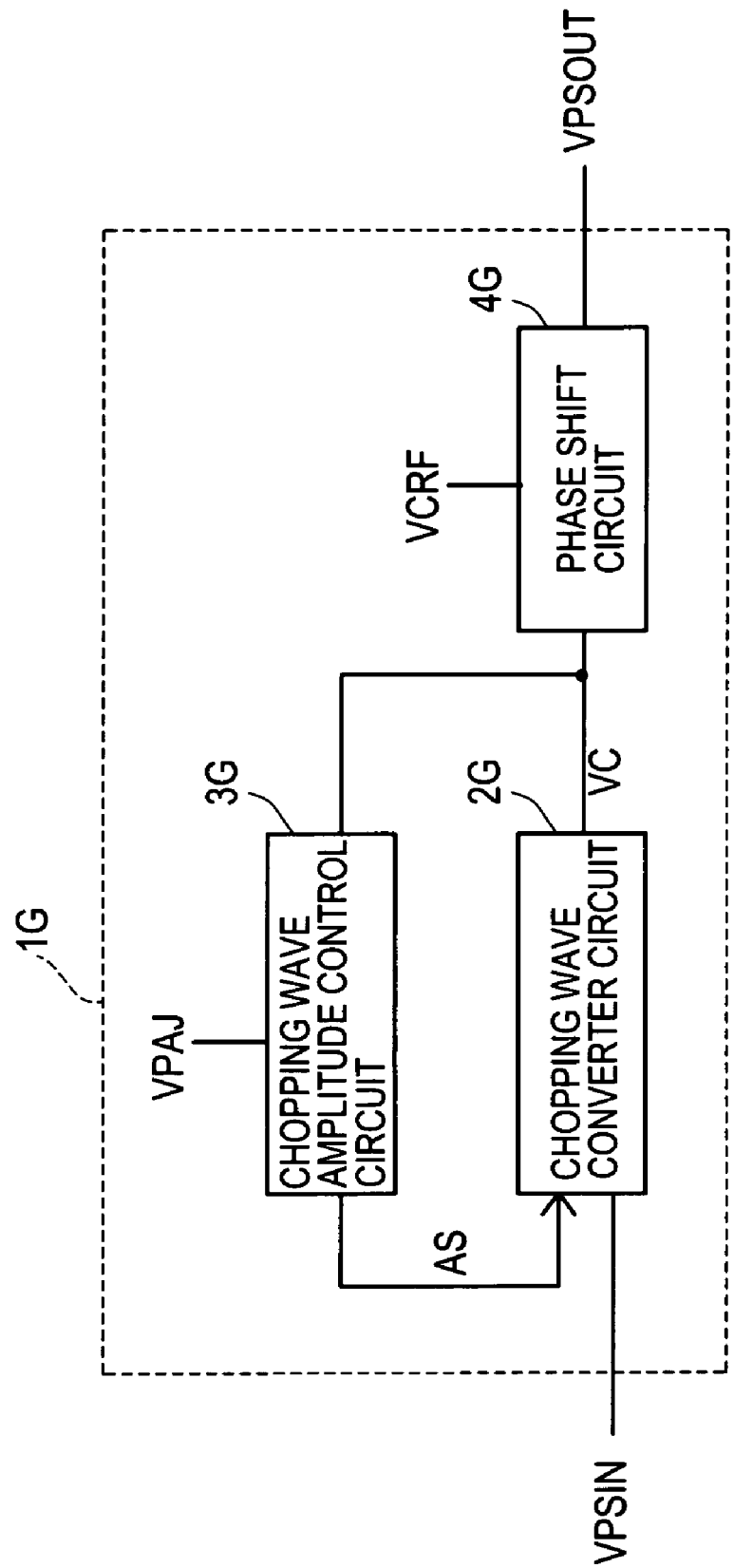
FIG. 1 is a block diagram showing a principle of the present invention.

FIG. 1 shows a principle diagram of the present invention. A phase adjuster circuit 1G includes a chopping wave converter circuit 2G, a chopping wave amplitude control circuit 3G, and a phase shift circuit 4G. A pulse string signal VPSIN is inputted to the chopping wave converter circuit 2G and the chopping wave converter circuit 2G outputs a chopping wave VC. The pulse string signal VPSIN is a signal having a given frequency fr. The chopping wave VC and a threshold value VCRF are inputted to a phase shift circuit 4G and the phase shift circuit 4G outputs a phase shift pulse string signal VPSOUT. Also, the chopping wave VC and an amplitude reference value VPAJ are inputted to the chopping wave amplitude control circuit 3G. Then, an adjustment signal AS that is outputted from the chopping wave amplitude control circuit 3G is inputted to the chopping wave converter circuit 2G to constitute a feedback route.

The chopping wave converter circuit 2G converts the pulse string signal VPSIN into the chopping wave VC. The chopping wave VC and the amplitude reference value VPAJ are inputted to the chopping wave amplitude control circuit 3G. In this example, the amplitude reference value VPAJ is a predetermined value that is the base of determination of the amplitude value of the chopping wave VC. The amplitude reference value VPAJ is, for example, an average value of the amplitude values of the chopping waves, a peak value of the amplitude, or a bottom value of the amplitude. The chopping wave amplitude control circuit 3G compares the amplitude value of the chopping wave VC with the amplitude reference value VPAJ, and outputs the adjustment signal AS corresponding to a difference between the amplitude value of the chopping wave VC and the amplitude reference value VPAJ to the chopping wave converter circuit 2G. The chopping wave converter circuit 2G changes a slope of the chopping wave VC according to the adjustment signal AS to adjust the amplitude value of the chopping wave VC. The above arrangement constitutes a feedback loop, and the amplitude value of the chopping wave VC is maintained to a constant value corresponding to the amplitude reference value VPAJ.

The phase shift circuit 4G binaries the chopping wave VC according to the threshold value VCRF, and outputs the phase shift pulse string signal VPSOUT that is a pulse string signal shifted in phase with respect to the original pulse string signal VPSIN. The amount of phase shift of the phase shift pulse string signal VPSOUT with respect to the phase of the pulse string signal VPSIN is determined according to the potential relationship of the threshold value VCRF with respect to the voltage range of the amplitude of the chopping wave VC. Therefore, the threshold value VCRF is appropriately determined, thereby making it possible to determine the amount of phase shift to a given value, for example, a delay of 90°. Then, the phase shift pulse string signal VPSOUT that is outputted from the phase shift circuit 4G is used for minute signal amplitude of synchronous detection or delay detection together with the pulse string signal VPSIN in a downstream circuit not shown.

With the above structure, the phase adjuster circuit 1G according to the present invention maintains the amplitude value of the chopping wave VC to a constant value that is determined according to an amplitude reference value VPAJ. Even in the case where the frequency fr of the pulse string signal VPSIN is shifted, it is possible to maintain the amount of phase shift of the phase shift pulse string signal VPSOUT to a constant value. Therefore, the stable minute signal amplifying operation can be conducted without receiving the temperature change.

Also, the amount of phase shift is determined according to the chopping wave VC whose slope is the constant value, thereby making it possible to provide a proportional relationship between the amount of change of the threshold value VCRF and the amount of phase shift. As a result, the amount of phase shift can be ready finely adjusted.

Figure 2:
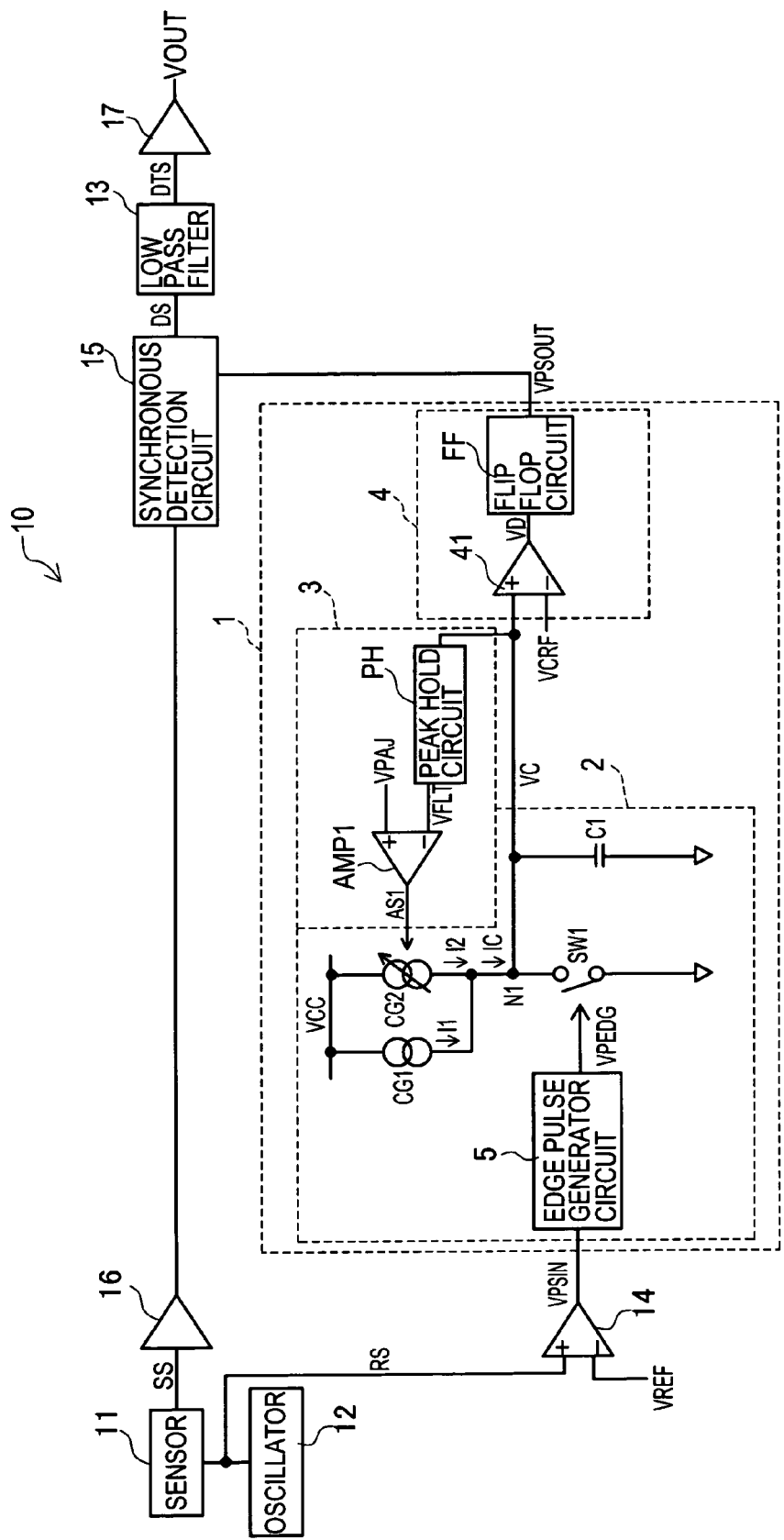
FIG. 2 is a circuit diagram showing a synchronous detection circuit 10 according to a first embodiment.

A first embodiment according to the present invention will be described with reference to FIGS. 2 to 5. FIG. 2 shows a synchronous detection circuit 10 according to a first embodiment. The synchronous detection circuit 10 includes a phase adjuster circuit 1, a sensor 11, an oscillator 12, a low pass filter 13, a comparator 14, a synchronous detection circuit 15, and amplifiers 16 and 17. A carrier wave RS that is outputted from the oscillator 12 is inputted to the sensor 11 and also inputted to a non-inverting input of the comparator 14. A reference threshold value VREF is inputted to an inverting input of the comparator 14. An output signal SS is outputted from the sensor 11, and then inputted to the synchronous detection circuit 15 through the amplifier 16. A phase shift pulse string signal VPSOUT that is outputted from the phase adjuster circuit 1 is inputted to the synchronous detection circuit 15. A detection signal DS that is outputted from the synchronous detection circuit 15 is inputted to the low pass filter 13. A demodulation signal DTS is outputted from the low pass filter 13, and then inputted to the amplifier 17. An output signal VOUT is outputted from the amplifier 17.

The phase adjuster circuit 1 includes a chopping wave converter circuit 2, a chopping wave amplitude control circuit 3, and a phase shift circuit 4. The chopping wave converter circuit 2 includes an edge pulse generator circuit 5, a switch SW1, a capacitor C1, and constant current source circuits CG1 and CG2. A pulse string signal VPSIN is inputted to the edge pulse generator circuit 5 and the edge pulse generator circuit 5 outputs an edge pulse string signal VPEDG. Constant current source circuits CG1 and CG2 are connected in parallel to each other between a supply voltage VCC and a nord N1, and the switch SW1 and the capacitor C1 are connected in parallel to each other between the node N1 and the ground. The edge pulse string signal VPEDG is inputted to a control terminal of the switch SW1. Currents I1 and I2 that are outputted from the constant current source circuits CG1 and CG2, respectively, are combined together, and then charged in or discharged from the capacitor C1 as a current IC. In this example, when the current I1 is held constant, and the current I2 is variable according to the adjustment signal AS1, there is advantageous in that the fine adjustment of the current IC can be more accurately conducted. Also, the chopping wave VC is outputted from the node N1.

The chopping wave amplitude control circuit 3 includes a peak hold circuit PH and an operational amplifier AMP1. The chopping wave VC is inputted to the peak hold circuit PH, and the peak hold circuit PH outputs a peak voltage value VFLT. A peak voltage value VFLT is inputted to an inverting input of the operational amplifier AMP1, and an amplitude reference value VPAJ is inputted to a non-inverting input. An adjustment signal AS1 that is outputted from the operational amplifier AMP1 is inputted to the constant current source circuit CG2. The constant current source circuit CG2 variably controls the current I2.

The phase shift circuit 4 includes a comparator 41 and a flip flop circuit FF. The chopping wave VC is inputted to a non-inverting input of the comparator 41, and a threshold value VCRF is inputted to an inverting input. A pulse string signal VD that is outputted from the comparator 41 is inputted to the flip flop circuit FF. A phase shift pulse string signal VPSOUT is outputted from the flip flop circuit FF.

Figure 3:
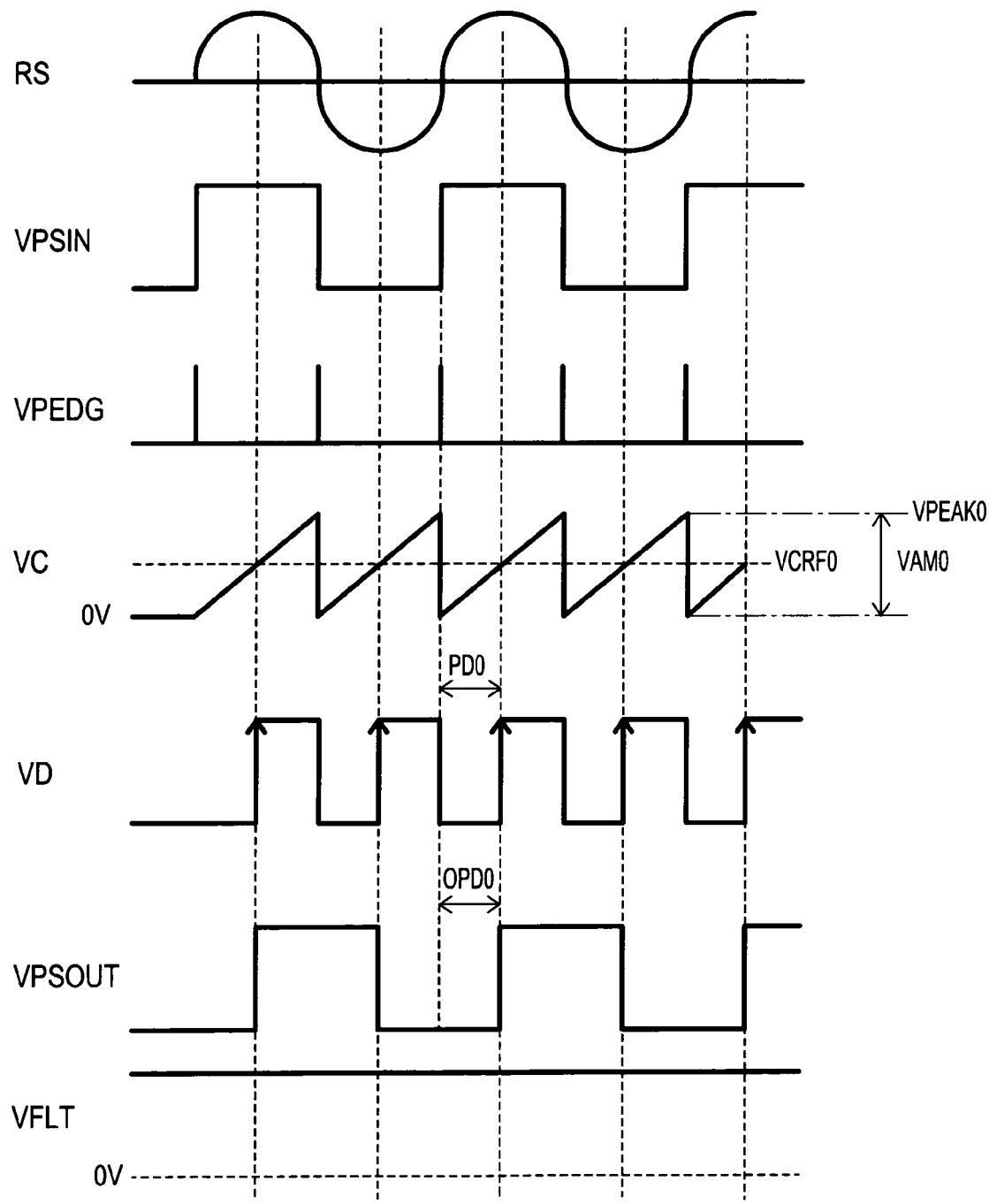
FIG. 3 is a timing chart of the synchronous detection circuit 10 according to the first embodiment (part 1)

The operation of the synchronization detection circuit 10 will be described with reference to a timing chart shown in FIG. 3. The carrier wave RS that is outputted from the oscillator 12 is converted into the pulse string signal VPSIN according to a reference threshold value VREF in the comparator 14. Then, the frequency and phase of the carrier wave RS are made equal to the frequency and phase of the pulse string signal VPSIN. The value of the carrier wave RS and the frequency fr of the pulse string signal VPSIN is set to a frequency value f0. The pulse string signal VPSIN is inputted to the chopping wave converter circuit 2.

The chopping wave converter circuit 2 conducts the operation of converting the pulse string signal VPSIN into the chopping wave VC. In the edge pulse generator circuit 5, the edge pulse string signal VPEDG is first generated in correspondence with the leading edge and the trailing edge of the pulse string signal VPSIN (FIG. 3). During the low level of the edge pulse string signal VPEDG, the capacitor C1 is charged with the current IC because the switch SW1 is rendered nonconductive. Also, during the high level of the edge pulse string signal VPEDG, the current IC is discharged from the capacitor C1 because the switch SW1 is rendered conductive. Therefore, the peak value VPEAK of the chopping wave VC is expressed by the following expression (1) with the use of the frequency fr of the carrier wave RS, the capacitance Ca of the capacitor C1, and the current IC.

$$VPEAK = IC/(2 \times Ca \times fr) \quad (1)$$

It is found from the expression (1) that the peak value VPEAK increases or decreases in proportion to the increase or decrease of the current IC and the frequency fr.

The phase shift circuit 4 conducts the operation of generating the phase shift pulse string signal VPSOUT whose phase is shifted with respect to the pulse string signal VPSIN. In this example, it is assumed that the amplitude value of the chopping wave VC at the time of frequency value f0 is an amplitude value VAM0, and the peak value of the amplitude value is set to a peak value VPEAK0 (FIG. 3). Then, the value of the threshold value VCRF is set to an arbitrary value within a range of the amplitude value VAM0, thereby making it possible to adjust the value of the amount of phase shift of the leading edge of the pulse string signal VD with respect to the edge pulse string signal VPEDG in a range of the phase delay that is larger than 0° but smaller than 180°. For example, when the threshold value VCRF is set to 0 (V), the value of the phase shift amount PD0 becomes 0°. Also, when the threshold value VCRF is set to a value of the peak value VPEAK0, the value of the phase shift amount PD0 has a delay of 180°. In this embodiment, the threshold value VCRF is set to the threshold value VCRF0 which is a voltage value of ½ of the amplitude value VAM0, to thereby provide a phase delay of 90°. In the actual circuit design, a dead zone is provided in each of the upper limit and the lower limit of the amplitude value VAM0. For example, in the case where the dead zone is provided in a range of ⅙ of the amplitude value, the adjustment of the phase delay amount is set in a range of from 30° to 150°.

Then, the pulse string VD is divided into ½ by the flip flop FF, to thereby obtain the phase pulse string signal VPSOUT that is comprised of a pulse string of the frequency value V0 that is equal to the pulse string signal VPSIN. The phase shift amount OPD0 of the leading edge of the phase shift pulse string signal VPSOUT in this situation with respect to the edge pulse string signal VPEDG also has a phase delay of 90°.

The phase shift pulse string signal VPSOUT that has been obtained by shifting the phase of the pulse string signal VPSIN is inputted to the synchronous detection circuit 15. In the synchronous detection circuit 15, the output signal SS of the sensor 11 is synchronously detected by using the phase shift pulse string signal VPSOUT. the demodulation signal DTS from which only the original signal component of the sensor 11 has been detected is obtained by the low pass filter 13, and the signal component of the demodulation signal DTS is amplified by the amplifier 17.

Now, the description will be given of the chopping wave converter circuit 2 and the chopping wave amplitude control circuit 3. The chopping wave converter circuit 2 and the chopping wave amplitude control circuit 3 conduct the feedback control that controls the amplitude value VAM of the chopping wave VC to a constant value corresponding to the amplitude reference value VPAJ.

Figure 4:
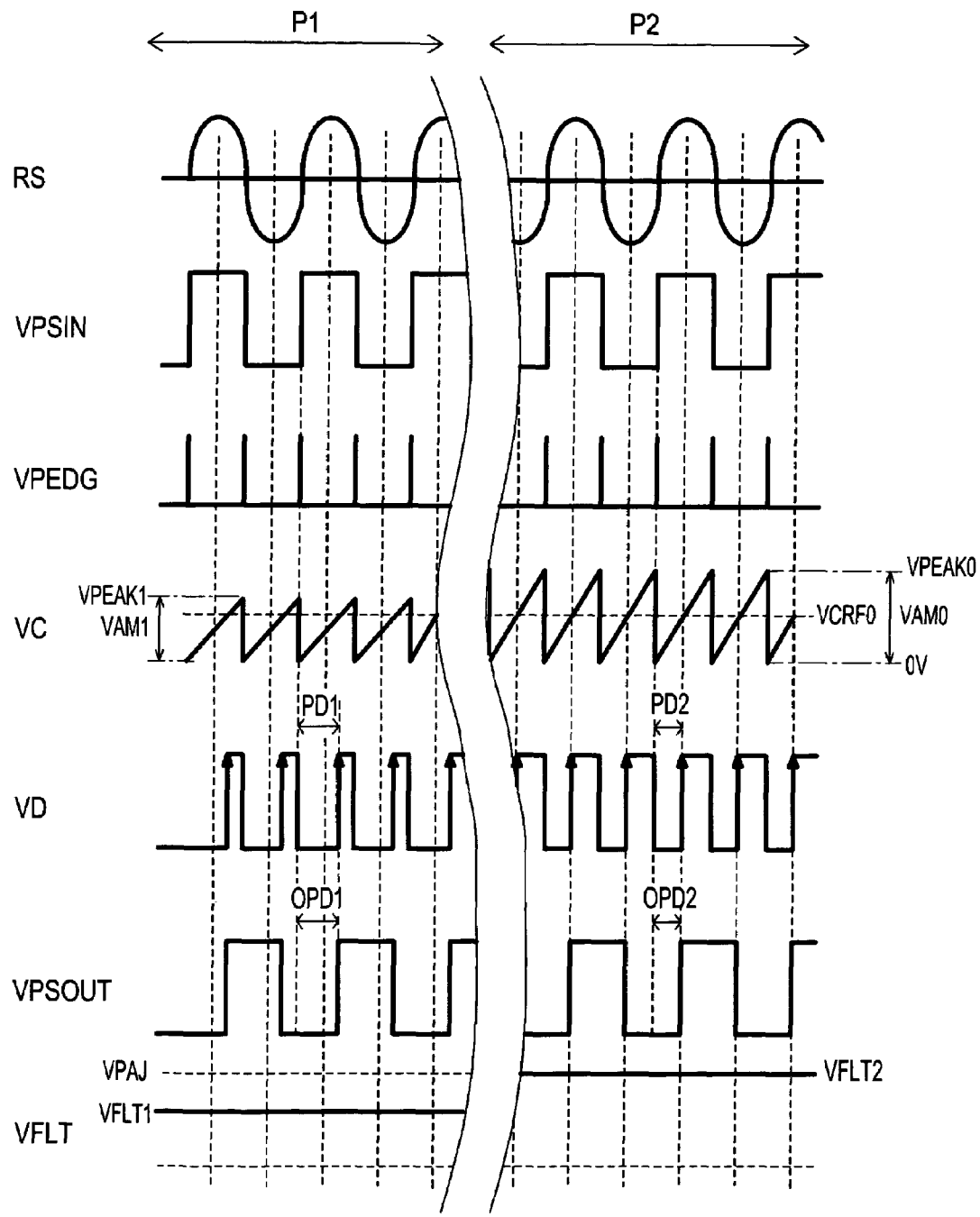
FIG. 4 is a timing chart of the synchronous detection circuit 10 according to the first embodiment (part 2)

A description will be given of the operation in the case where the frequency value f0 of the carrier wave RS is shifted to a higher frequency value, that is, a frequency value f1 due to an influence of the temperature change with reference to FIG. 4. First, a description will be given of the operation in a period P1 where the feedback control is not conducted. The peak value of the chopping wave VC is lowered as expressed by the expression (1) as the frequency becomes high, and the peak value changes from VPEAK0 to VPEAK1 (FIG. 4). Also, the amplitude value of the chopping wave VC reduces from VAM0 to VAM1. Also, the threshold value VCRF0 becomes a constant value before and after the frequency value is shifted from f0 to f1. In this situation, because the chopping wave VC has a soaring slope, the delay amount of phase of the pulse string VD becomes large according to the amount of reduction of the amplitude value. Therefore, the phase shift amount PD1 of the leading edge of the pulse string VD with respect to the edge pulse string signal VPEDG has a phase delay that is larger than 90°. Also, the phase shift amount OPD1 of the leading edge of the phase shift pulse string signal VPSOUT that is outputted from the flip flop FF with respect to the edge pulse string signal VPEDG also has a phase delay that is larger than 90°. That is, the phase shift amount OPD of the phase shift pulse string signal VPSOUT fluctuates from the phase shift amount of a target value (phase delay of 90°) according to the fluctuation of the frequency fr of the carrier wave RS.

Now, the operation of the feedback control will be described. In the period P1, the value of the peak voltage value VFLT that is outputted from the peak hold circuit PH becomes a voltage value VFLT1 (FIG. 4) which is lower than the amplitude reference value VPAJ. Therefore, the operational amplifier AMP1 outputs the adjustment signal AS1 according to a difference between the voltage value VFLT1 and the amplitude reference value VPAJ. The constant current source circuit CG2 increases a current I2 according to the adjustment signal AS1 to increase the current IC. Then, the slope of the chopping wave VC increases with an increase of the current IC by the expression (1). Then, the feedback control is conducted such that the peak voltage value VFLT becomes equal to the amplitude reference value VPAJ.

As indicated by the period P2 in FIG. 4, when the peak voltage value is set to a peak voltage value VFLT2 so as to be equal to the amplitude reference value VPAJ, the feedback control is completed. As a result, the amplitude value of the chopping wave VC is returned to the amplitude value VAM0 which is a state before the frequency fr fluctuates. Also, the phase shift amount PD2 of the leading edge of the pulse string VD has a phase delay of 90°, and the phase shift amount OPD2 of the leading edge of the phase shift pulse string signal VPSOUT also has a phase delay of 90°.

That is, in the case where the frequency value f0 of the carrier wave RS is shifted to a higher frequency value and set to the frequency value f1, the phase shift amount OPD of the phase shift pulse string signal VPSOUT is maintained in the phase delay of 90° which is a target value under the feedback control by the chopping wave amplitude control circuit 3.

Figure 5:
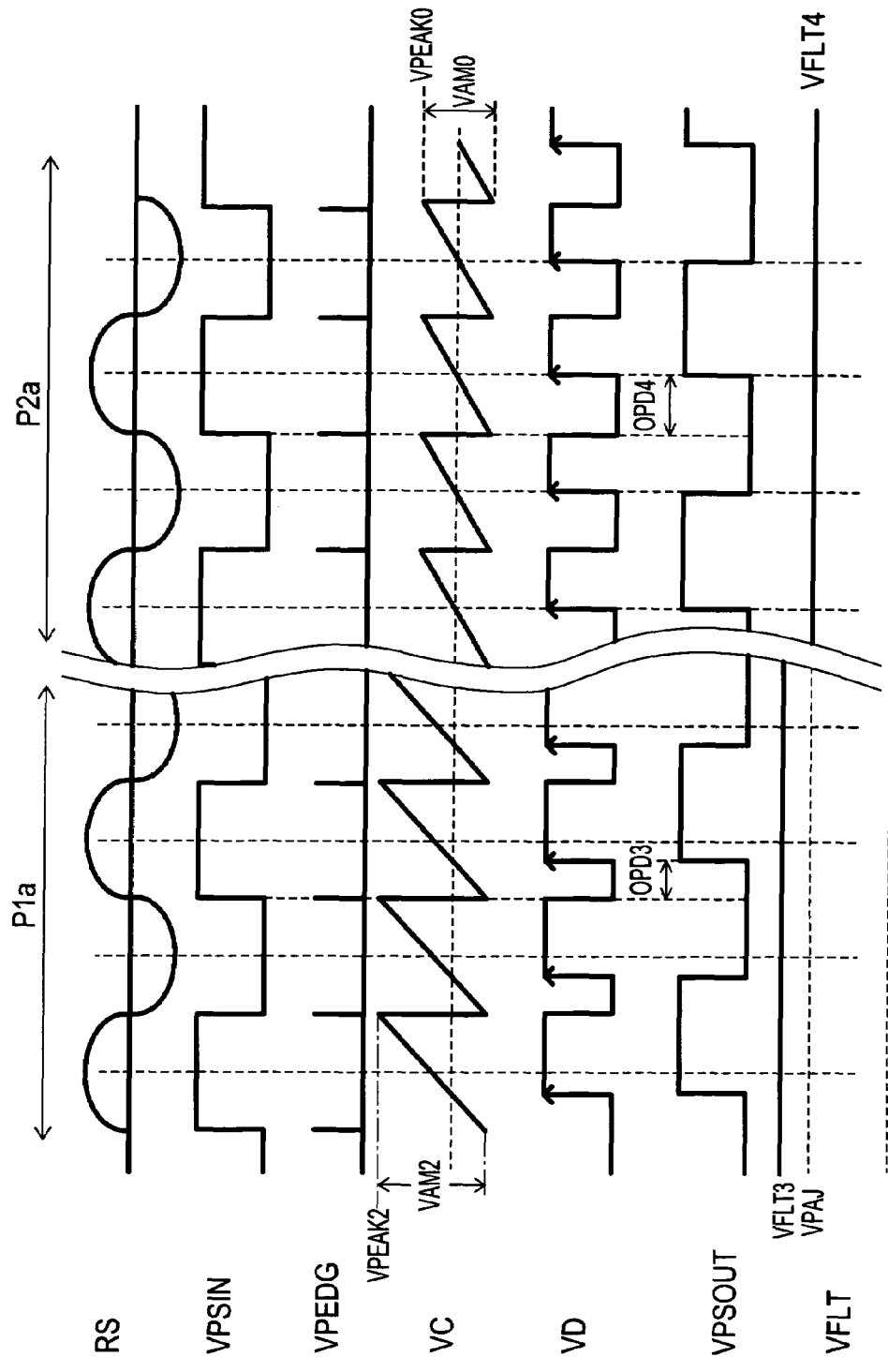
FIG. 5 is a timing chart of the synchronous detection circuit 10 according to the first embodiment (part 3)

A description will be given of a case in which the frequency value f0 of the carrier wave RS is shifted to a lower frequency value and set to the frequency value f2 due to an influence of the temperature change with reference to FIG. 5. When the frequency is lowered, the peak value of the chopping wave VC increases in a period P1a by the expression (1), and the peak value changes from VPEAK0 to VPEAK2 (FIG. 5). Also, the amplitude value of the chopping wave VC increases from the amplitude value VAM0 to VAM2. Therefore, the phase shift amount OPD3 of the leading edge of the phase shift pulse string signal VPSOUT which is outputted from the flip flop FF with respect to the edge pulse string signal VPEDG has a phase delay that is smaller than 90°. Then, the operational amplifier AMP1 outputs the adjustment signal AS1 according to a difference between the voltage value VFLT3 and the amplitude reference value VPAJ. The constant current source circuit CG2 reduces the current I2 according to the adjustment signal AS1 due to the operation of the feedback control to reduce the current IC. Then, the slope of the chopping wave VC decreases with a reduction of the current IC by the expression (1). As a result, in the period P2a, the peak voltage value is set to a peak voltage value VFLT4, and the amplitude value of the chopping wave VC is returned to the amplitude value VAM0. That is, even in the case where the frequency value f0 of the carrier wave RS is shifted to a lower frequency value, a phase shift amount OPD4 of the phase shift pulse string signal VPSOUT is maintained in a phase delay of 90° which is a target value due to the feedback control by the chopping wave amplitude control circuit 3.

As described above in detail, the synchronous detection circuit 10 according to the first embodiment is capable of maintaining the amplitude value VAM of the chopping wave VC to a constant value without any influence of the fluctuation of the frequency fr of the carrier wave RS under the feedback control by the chopping wave amplitude control circuit 3. As a result, even if the frequency fr of the carrier wave RS fluctuates, the phase shift amount OPD of the phase shift pulse string signal VPSOUT can be prevented from fluctuating from the set value. Therefore, it is possible to conduct the stable detecting operation. Also, it is possible to realize the operation of maintaining the phase shift amount OPD to a constant value without any influence of the fluctuation of the frequency fr.

Also, the synchronous detection circuit 10 according to the first embodiment adjusts the phase shift amount OPD of the phase shift pulse string signal VPSOUT by using the chopping wave VC with a constant slope, which is different from a case in which the phase shift amount is determined by using a differentiation circuit having a time constant. As a result, because the amount of change of the threshold value VCRF and the phase shift amount OPD can satisfy the proportional relationship, it is possible to readily finely adjust the phase shift amount OPD. Also, the current IC is variably controlled to determine the phase shift amount, thereby making it possible to more simply adjust the phase shift amount OPD as compared with a case in which the capacitance Ca of the capacitor C1 and the resistance value are variably controlled.

Figure 6:
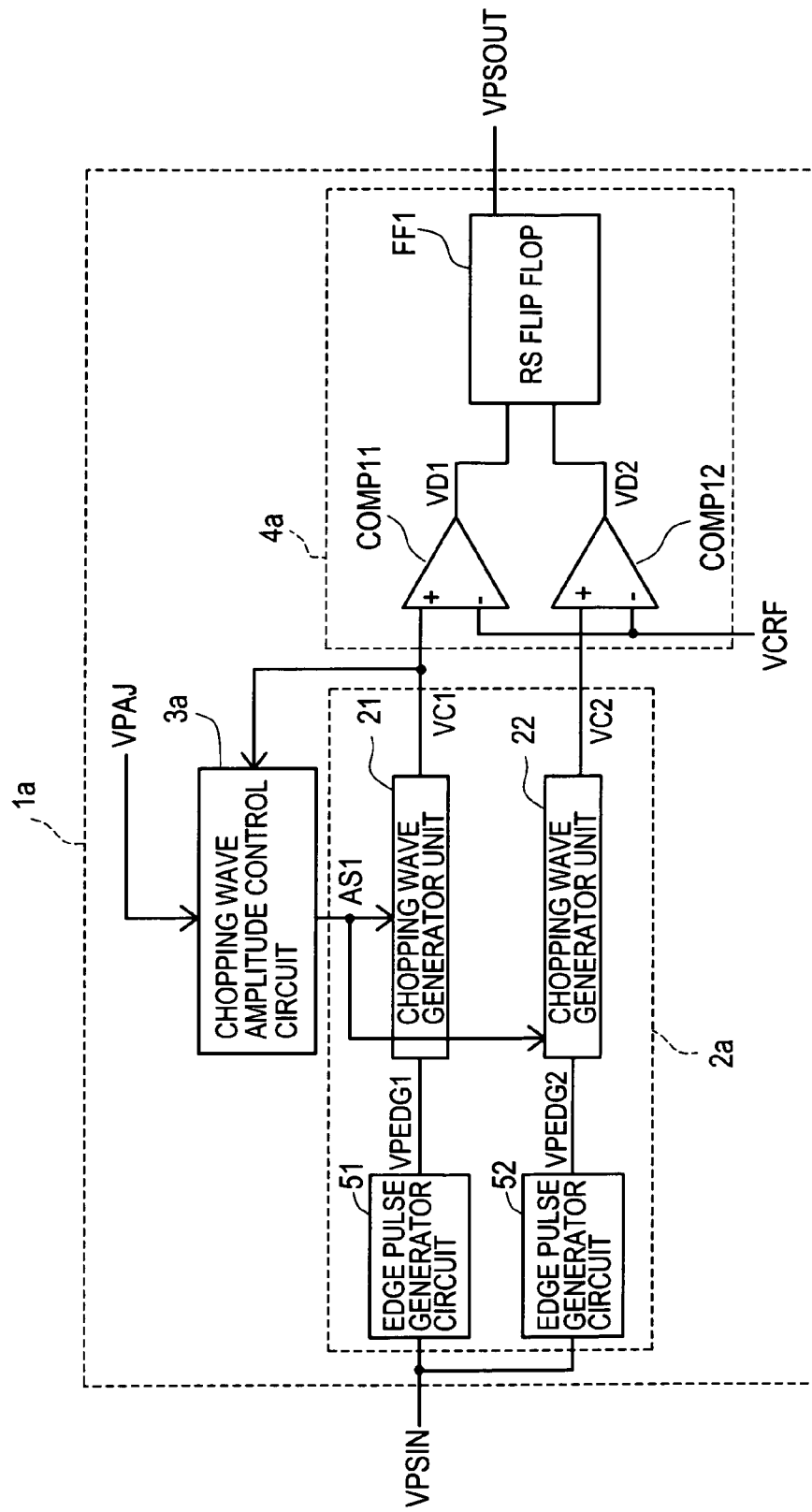
FIG. 6 is a circuit diagram showing a phase adjuster circuit 1a according to a second embodiment.

A second embodiment of the present invention will be described with reference to FIGS. 6 and 7. FIG. 6 shows a phase adjuster circuit 1a according to the second embodiment. The phase adjuster circuit 1a includes a chopping wave converter circuit 2a, a chopping wave amplitude control circuit 3a, and a phase shift circuit 4a. The chopping wave converter circuit 2a includes edge pulse generator circuits 51 and 52, and chopping generator units 21 and 22. The edge pulse generator circuits 51 and 52 output edge pulse string signals VPEDG1 and VPEDG2, respectively. The edge pulse string signals VPEDG1 and VPEDG2, and the adjustment signal AS1 that is outputted from the chopping wave amplitude control circuit 3a, are inputted to the chopping wave generator units 21 and 22. Then, the chopping wave generator units 21 and 22 output the chopping waves VC1 and VC2, respectively. The structures of the chopping wave generator units 21 and 22 are identical with those of the chopping wave converter circuit 2 in the first embodiment, and therefore their detailed description will be omitted.

The phase shift circuit 4a includes comparators COMP11 and COMP12, and an RS flip flop FF1. The chopping waves VC1 and VC2 are inputted to the non-inverting inputs of the comparators COMP 11 and COMP12, respectively, and a threshold value VCRF is inputted to an inverting input thereof. The pulse strings VD1 and VD2 that are outputted from the comparators COMP11 and COMP12 are inputted to a set input and a reset input of the RS flip flop FF1, respectively. A phase shift pulse string signal VPSOUT is outputted from the RS flip flop FF1.

The operation of the phase adjuster circuit 1a will be described with reference to FIG. 7. The chopping wave converter circuit 2a conducts the operation of converting the pulse string signal VPSIN into the chopping waves VC1 and VC2. The edge pulse generator circuit 51 first generates the edge pulse string signal VPEDG1 according to the leading edge of the pulse string signal VPSIN. Also, the edge pulse generator circuit 52 generates the edge pulse string signal VPEDG 2 according to the trailing edge of the pulse string signal VPSIN. Therefore, the edge pulse string signals VPEDG1 and VPEDG2 are shifted in the phase from each other by 180°. Also, the chopping wave converter circuit 2a converts the leading edge and the trailing edge of the pulse string signal VPSIN into edge pulse string signals, individually, which is different from the case of the first embodiment. As a result, it is possible to adjust the phase shift amount of the leading edge and the phase shift amount of the trailing edge, individually. Also, there is obtained the effect that the frequency of the pulse string signal VPSIN is divided into ½.

The chopping wave generator unit 21 generates the chopping wave VC1 according to the edge pulse string signal VPEDG1, and the chopping wave generator unit 22 generates the chopping wave VC2 according to the edge pulse string signal VPEDG2. In this situation, the chopping waves VC1 and VC2 are shifted in the phase from each other by 180°.

Figure 7:
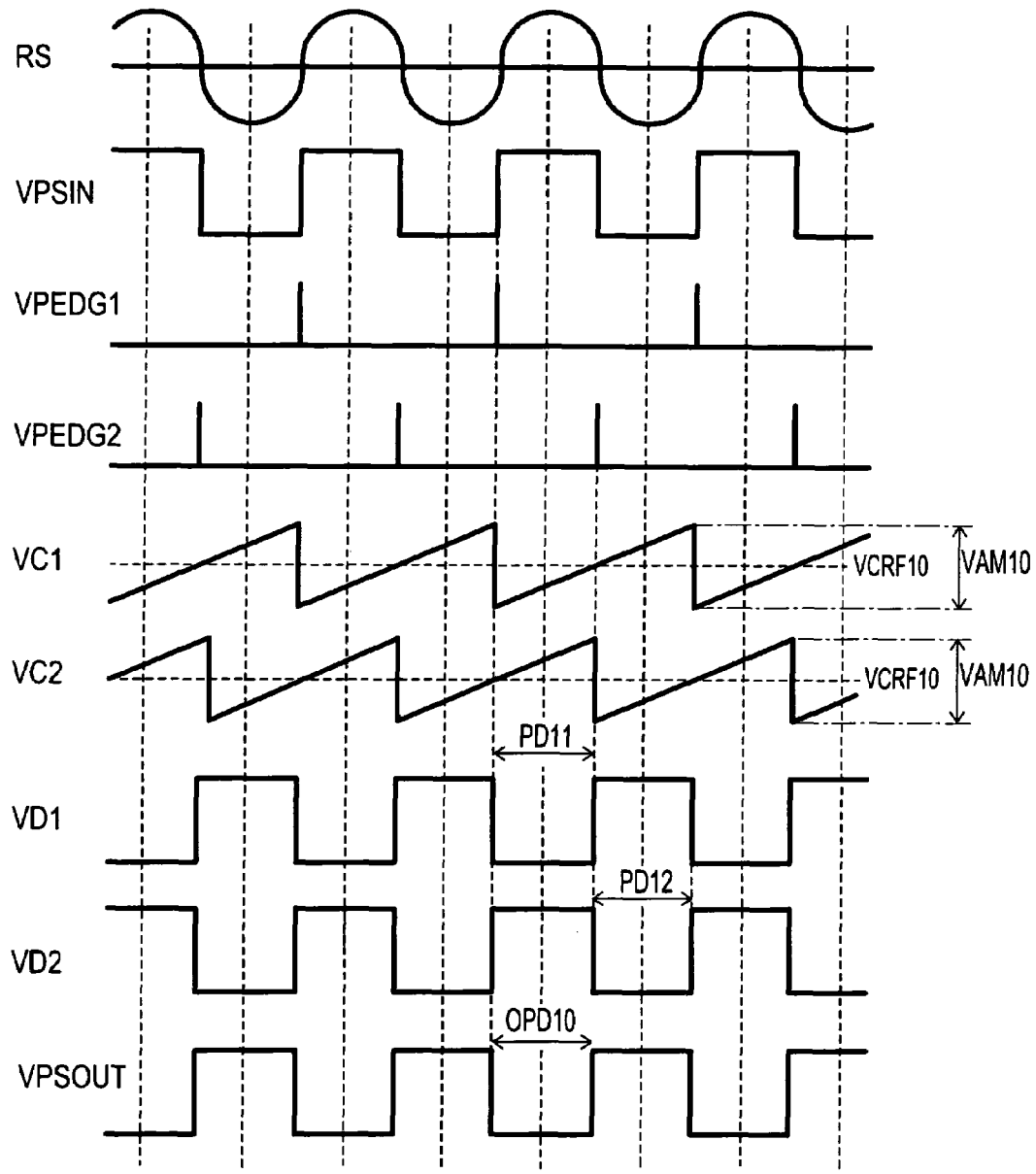
FIG. 7 is a timing chart of the phase adjuster circuit 1a according to the second embodiment.

In the comparator COMP11 of the phase shift circuit 4a, the value of the threshold value VCRF is set to an arbitrary value within a range of the amplitude value VAM10 (FIG. 7). As a result, the value of the phase shift amount PD11 of the leading edge of the pulse string VD1 with respect to the edge pulse string signal VPEDG1 can be adjusted within a range of the phase delay which is larger than 0° but smaller than 360°. Likewise, in the comparator COMP12, the value of the threshold value VCRF is set to an arbitrary value within a range of the amplitude value VAM10. As a result, the value of the phase shift amount PD12 can be adjusted within a range of the phase delay which is larger than 0° but smaller than 360°. In this embodiment, the threshold value VCRF is set to a threshold value VCRF10 which is a voltage of ½ of the amplitude value VAM10. With this operation, the values of the phase shift amounts PD11 and PD12 have a phase delay of 180°. Then, the RS flip flop FF1 obtains the phase shift pulse string signal VPSOUT that is comprised of the pulse string of the frequency which is equal to that of the pulse string signal VPSIN. In this situation, the phase shift amount OPD10 of the phase shift pulse string signal VPSOUT with respect to the pulse string signal VPSIN has a phase delay of 180°.

Then, the chopping wave amplitude control circuit 3a constantly controls the amplitude value VAM10 of the chopping waves VC1 and VC2 regardless of the fluctuation of the frequency fr of the carrier wave RS. Therefore, even in the case where the frequency fr of the pulse string signal VPSIN is shifted, it is possible to maintain the value of the phase shift amount OPD10 of the phase shift pulse string signal VPSOUT to the phase delay amount of 180°.

As described above in detail, even in the case where the frequency fr of the carrier wave RS is shifted, the phase adjuster circuit 1a according to the second embodiment is capable of preventing the phase shift amount OPD10 of the phase shift pulse string signal VPSOUT from fluctuating from the set value. Accordingly, it is possible to conduct the stable detecting operation.

The chopping wave generator units 21 and 22 have the same circuit structure. Accordingly, it can be assumed that a change in the amplitude value of the chopping wave due to the temperature change or the temporal change is equivalent between the chopping waves VC1 and VC2. For that reason, as shown in FIG. 6, it is estimated that it is necessary that only the amplitude value of the chopping wave VC1 is monitored by the chopping wave amplitude control circuit 3a, and the feedback result is reflected by the chopping wave generator units 21 and 22. In the case of conducting the more stable detecting operation, the chopping wave VC2 may be also inputted to the chopping wave amplitude control circuit 3a and monitored.

Figure 8:
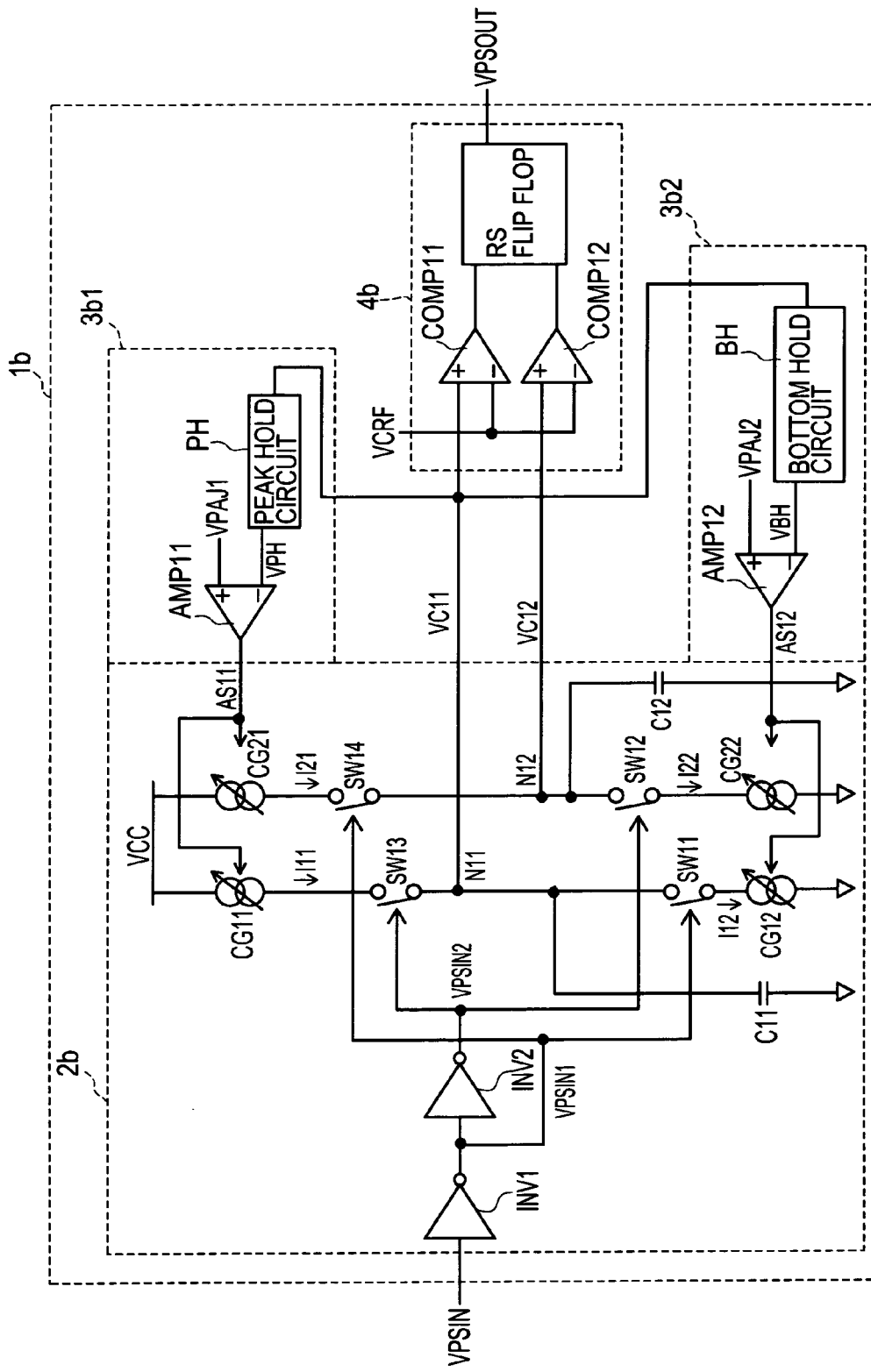
FIG. 8 is a circuit diagram showing a phase adjuster circuit 1b according to a third embodiment.
Figure 9:
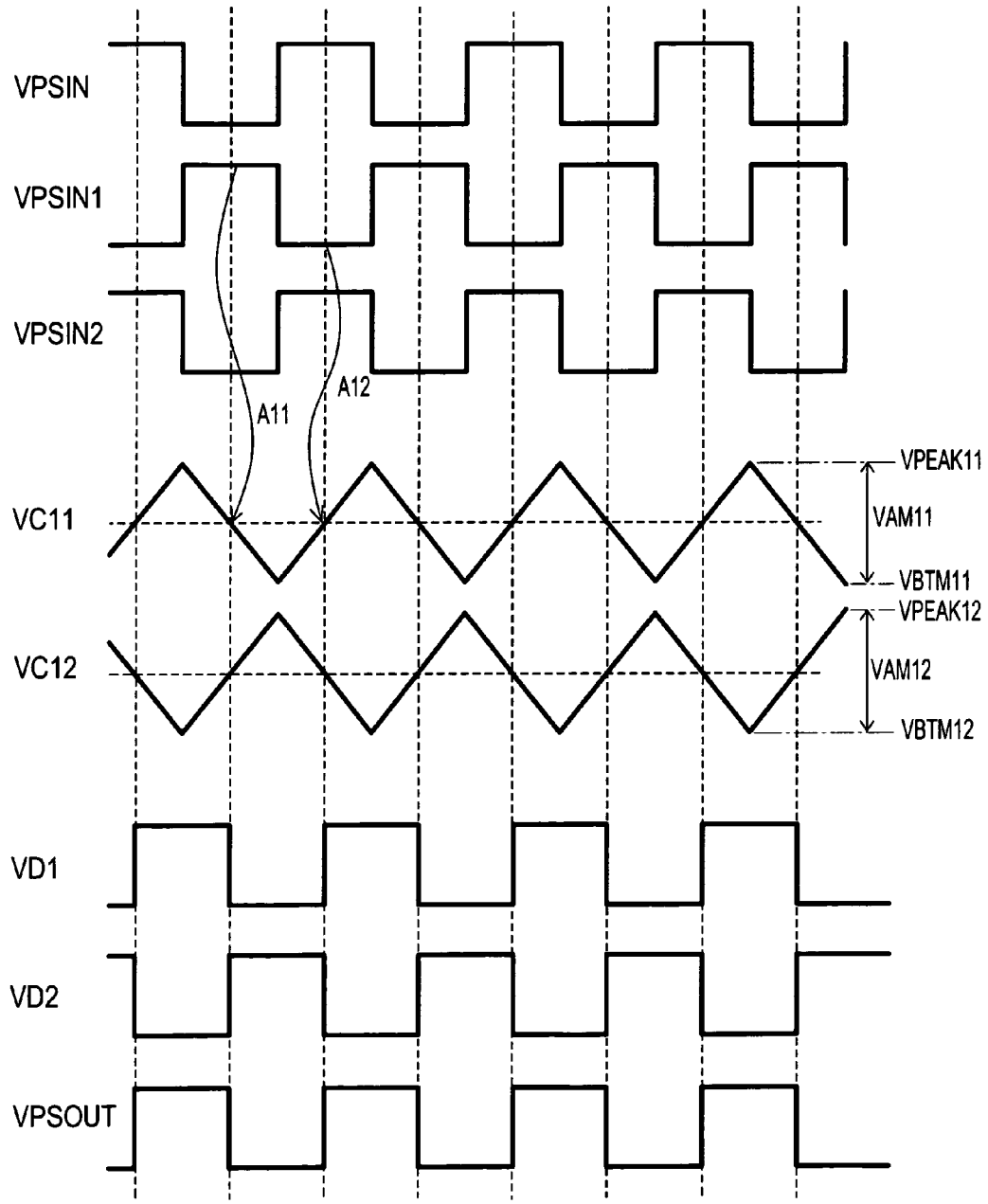
FIG. 9 is a timing chart of the phase adjuster circuit 1b according to the third embodiment.

A third embodiment of the present invention will be described with reference to FIGS. 8 and 9. FIG. 8 shows a phase adjuster circuit 1b according to a third embodiment. The phase adjuster circuit 1b includes a chopping wave converter circuit 2b, chopping wave amplitude control circuits 3b1, 3b2, and a phase shift circuit 4b. The chopping wave converter circuit 2b includes inverters INV1 and INV2, switches SW11 to SW14, capacitors C11 and C12, and constant current source circuits CG11, CG12, CG21, and CG22. The constant current source circuit CG11 and the switch SW13 are connected in series with each other between a supply voltage VCC and a node N11. The capacitor C11 is connected between the node N11 and the ground, and the switch SW11 and the constant current source circuit CG12 are connected in parallel to the capacitor C11. Likewise, the constant current source circuit CG21 and the switch SW14 are connected in series with each other between the supply voltage VCC and the node N12. The capacitor C12 is connected between the node N12 and the ground, and the switch SW12 and the constant current source circuit CG22 are connected in parallel to the capacitor C12. A pulse string signal VPSIN1 is inputted to the control terminals of the switch SW11 and the switch SW14. A pulse string signal VPSIN2 is inputted to the control terminals of the switch SW12 and the switch SW13. The capacitor C11 is charged with the current I11 from the constant current source circuit CG11, and the capacitor C11 is discharged by the current I12 of the constant current source circuit CG12. Also, the capacitor C12 is charged with the current I21 from the constant current source circuit CG21, and the capacitor C12 is discharged by the current I22 of the constant current source circuit CG22. The values of the currents I11 and I12 are made equal to each other, and the values of the currents I21 and I22 are made equal to each other. The chopping wave VC11 is outputted from the node N11, and the chopping wave VC12 is outputted from the node N12.

The chopping wave amplitude control circuit 3b1 includes a peak hold circuit PH, and an operational amplifier AMP11. The chopping wave VC11 is inputted to the peak hold circuit PH and the peak hold circuit PH outputs the peak voltage value VPH. The peak voltage value VPH is inputted to an inverting input of the operational amplifier AMP11, and an amplitude reference value VPAJ1 is inputted to a non-inverting input thereof. The adjustment signal AS11 that is outputted from the operational amplifier AMP11 is inputted to the constant current source circuits CG11 and CG21. Likewise, the chopping wave amplitude control circuit 3b2 includes a bottom hold circuit BH, and an operational amplifier AMP12. The chopping wave VC11 is inputted to the bottom hold circuit BH, and the bottom hold circuit BH outputs the bottom voltage value VBH. The adjustment signal AS12 that is outputted from the operational amplifier AMP12 is inputted to the constant current source circuits CG12 and CG22. Also, the structure of the phase shift circuit 4b is identical with that of the phase shift circuit 4a according to the second embodiment, and therefore its detailed description will be omitted.

The operation of the phase adjuster circuit 1b will be described with reference to FIG. 9. The chopping wave converter circuit 2b conducts the operation of converting the pulse string signal VPSIN into chopping waves VC11 and VC12. The switch SW11 is rendered conductive, and the switch SW13 is rendered non-conductive during the high level of the pulse string signal VPSIN1. Therefore, because the capacitor C11 is discharged by the current I12, the chopping wave VC11 has a downside constant slope (an arrow A11). Also, the switch SW11 is rendered non-conductive, and the switch SW13 is rendered conductive during the low level of the pulse string signal VPSIN1. Therefore, because the capacitor C11 is charged by the current I11, the chopping wave VC11 has an upside constant slope (an arrow A12). In this situation, because the values of the currents I11 and I12 are equal to each other, the upside slope is equal to the downside slope.

The phase shift circuit 4b conducts the operation of generating the phase shift pulse string signal VPSOUT whose phase has been shifted with respect to the pulse string signal VPSIN. The value of the threshold value VCRF is set to an arbitrary value within a range of the amplitude values VAM11 and VAM12. As a result, the value of the phase shift amount of the leading edge of the phase shift pulse string signal VPSOUT with respect to the pulse string signal VPSIN can be adjusted within a range of the phase delay which is larger than 0° but smaller than 180°.

The operation of the chopping wave amplitude control circuits 3b1 and 3b2 will be described. The peak value VPEAK11 of the chopping wave VC11 and the peak value VPEAK12 of the chopping wave VC12 are controlled to constant values according to the amplitude reference value VPAJ1 under the feedback control of the chopping wave amplitude control circuit 3b1. Also, the bottom value VBTM11 of the chopping wave VC11 and the bottom value VBTM12 of the chopping wave VC12 are controlled to constant values according to the amplitude reference value VPAJ2 under the feedback control of the chopping wave amplitude control circuit 3b2. Accordingly, the peak values and the bottom values of the chopping waves VC11 and VC12 are held constant without any influence of the frequency fr of the pulse string signal VPSIN, and therefore it is possible to maintain the amplitude values VAM11 and VAM12 to constant values.

Also, the phase adjuster circuit 1b adjusts the phase of the leading edge by the chopping wave VC11, and adjusts the phase of the trailing edge by the chopping wave VC12. Since the phase of the leading edge and the phase of the trailing edge can be then controlled, individually, it is possible to freely set the duty of the high level signal of the phase shift pulse string signal VPSOUT. Accordingly, in this embodiment, it is possible to maintain the duty of the phase shift pulse string signal VPSOUT to 50% regardless of the value of the threshold value VCRF.

As described above in detail, the phase adjuster circuit 1b according to the third embodiment is capable of maintaining the amplitude value VAM11 of the chopping wave VC11 and the amplitude value VAM12 of the chopping wave VC12 to constant values without being affected by the fluctuation of the frequency fr of the pulse string signal VPSIN under the feedback control by the chopping wave amplitude control circuits 3b1 and 3b2. As a result, even if the frequency fr of the pulse string signal VPSIN fluctuates, the phase shift amount of the phase shift pulse string signal VPSOUT can be prevented from fluctuating from the set value. As a result, it is possible to conduct the stable detecting operation.

Figure 10:
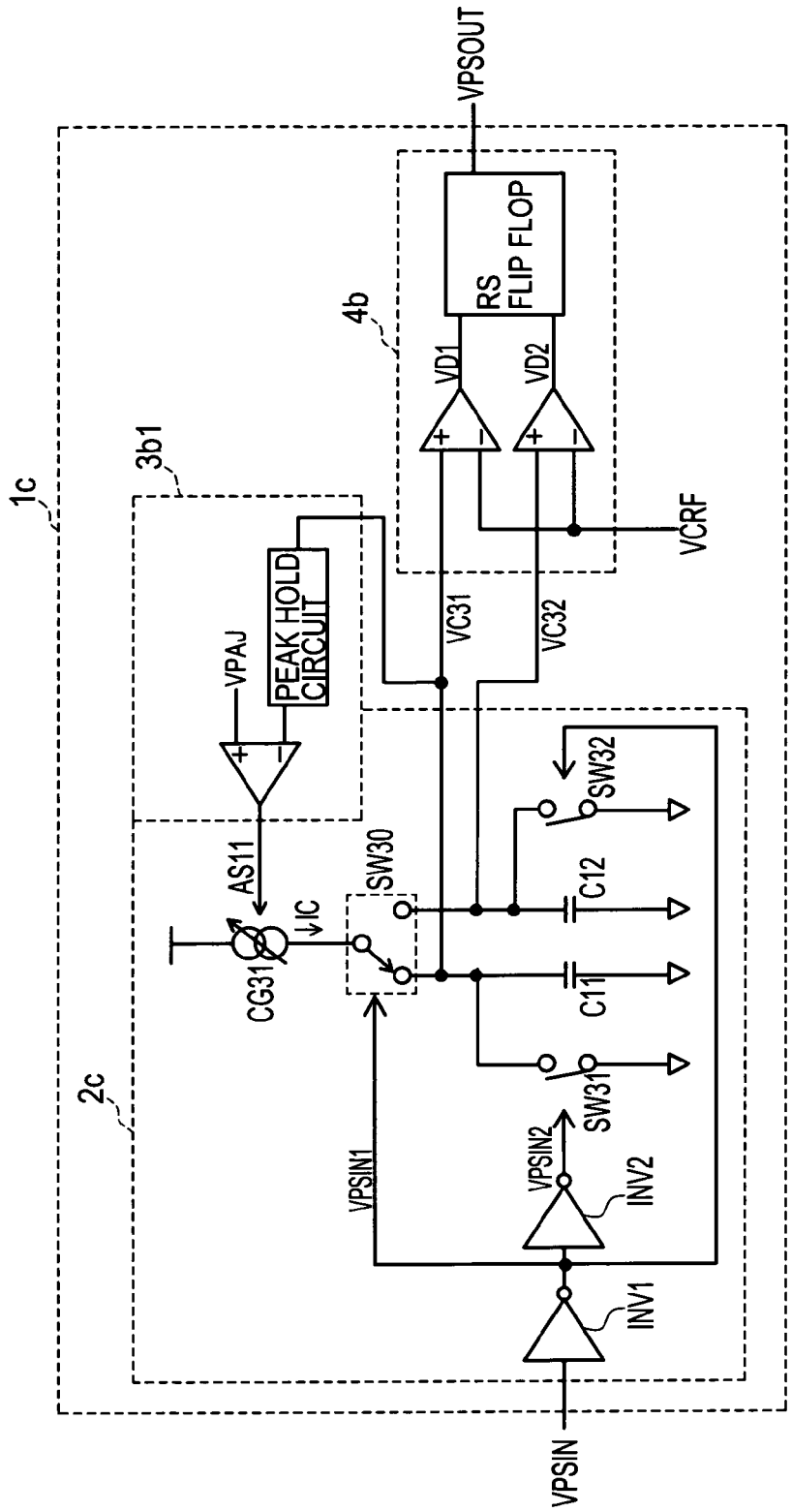
FIG. 10 is a circuit diagram showing a phase adjuster circuit 1c.

It is needless to say that the present invention is not limited to the above embodiment, but various improvements and modifications can be conducted within a scope that does not deviate from the sprits of the present invention. In the third embodiment of the present invention shown in FIG. 8, there are provided the constant current source circuits CG11, CG12, CG21, and CG22. However, the present invention is not limited to this embodiment. A constant current source circuit CG31 may be provided as in the phase adjuster circuit 1c shown in FIG. 10. The phase adjuster circuit 1c includes a chopping wave converter circuit 2c, a chopping wave amplitude control circuit 3b1, and a phase shift circuit 4b. The chopping wave converter circuit 2c includes inverters INV1 and INV2, switches SW30 to SW32, capacitors C11 and C12, and a constant current source circuit CG31. The pulse string signal VPSIN1 is inputted to the control terminals of the switches SW30 and SW32. The pulse string signal VPSIN2 is inputted to the control terminal of the switch SW31. The adjustment signal AS11 that is outputted from the chopping wave amplitude control circuit 3b1 is inputted to the constant current source circuit CG31. Other structures are identical with those of the phase adjuster circuit 1b according to the third embodiment, and therefore their detailed description will be omitted.

Figure 11:
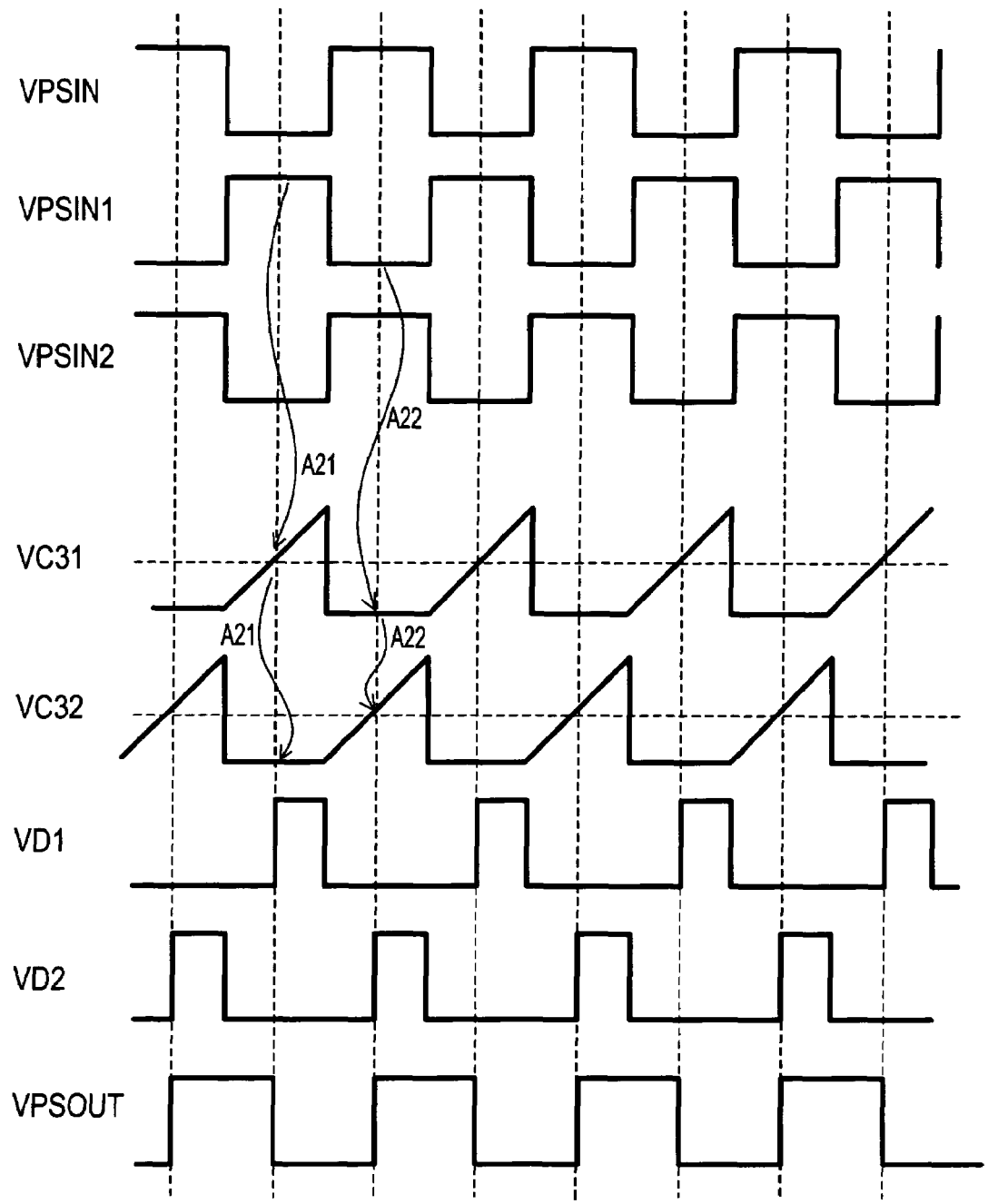
FIG. 11 is a timing chart of the phase adjuster circuit 1c shown in FIG. 10.

The operation of the chopping wave converter circuit 2c that is disposed in the phase adjuster circuit 1c will be described with reference to FIG. 11. The switch SW30 connects the constant current source circuit CG31 and the capacitor C11 during the high level of the pulse string signal VPSIN1. Also, the switch SW31 is rendered non-conductive, and the switch SW32 is rendered conductive. Accordingly, because the capacitor C11 is charged with the current IC, the chopping wave VC31 has an upside constant slope. Also, the chopping wave VC32 is maintained to 0(V) (an arrow A21). On the other hand, the switch SW30 connects the constant current source circuit CG31 and the capacitor C12 during the low level of the pulse string signal VPSIN1. Accordingly, because the capacitor C12 is charged with the current IC, the chopping wave VC32 has an upside constant slope. Also, the chopping wave VC31 is maintained to 0(V) (an arrow A22) Then, the phase shift circuit 4b conducts the operation of generating the phase shift pulse string signal VPSOUT whose phase has been shifted with respect to the pulse string signal VPSIN. Also, the amplitude values of the chopping waves VC31 and VC32 are maintained to constant values under the feedback control of the chopping wave amplitude control circuit 3b1. As a result, even if the frequency fr of the pulse string signal VPSIN fluctuates, the phase shift amount of the phase shift pulse string signal VPSOUT can be prevented from fluctuating from the set value.

In the phase adjuster circuit 1c, the constant current power circuit CG31 can be shared by the capacitors C11 and C12 by means of the switch SW30. Also, in the switches SW31 and SW32, electric charges are discharged through no constant current source circuit. As a result, the number of current source circuits can be reduced as compared with the phase adjuster circuit 1b (FIG. 8).

Also, in the phase adjuster circuit 1 according to the first embodiment, the output of the peak hold circuit PH is fed back to the operational amplifier AMP1. However, the present invention is not limited to this embodiment. The peak hold circuit PH may be replaced with an averaging circuit such as a low pass filter, in which an output of the averaging circuit is fed back to the operational amplifier AMP1, and the amplitude reference value VPAJ is set as the average value of the amplitude value of the chopping wave. As a result, because an influence of jittering of the chopping wave VC can be removed, it is possible to provide the phase adjuster circuit 1 that is not further influenced by the fluctuation of the frequency fr of the carrier wave RS.

Also, a signal that is inputted to the inverting input of the comparator 41 may be the output of the averaging circuit instead of the threshold value VCRF. As a result, it is possible to more precisely set the threshold value VCRF0 to the voltage of ½ of the amplitude value under the feedback control by the averaging circuit. As a result, it is possible to conduct the more stable detecting operation.

Figure 12:
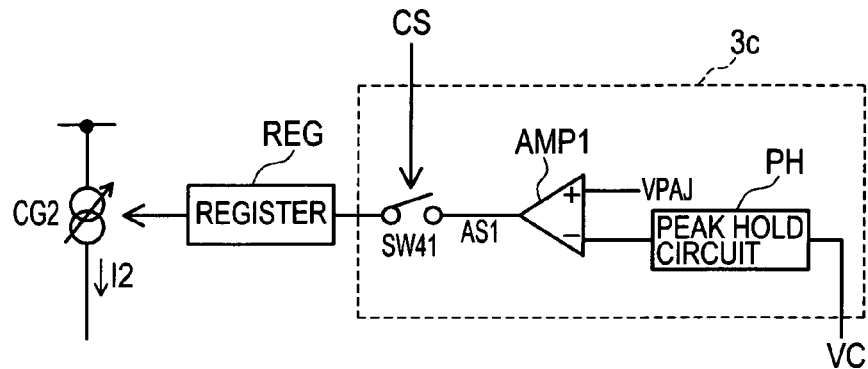
FIG. 12 is a circuit diagram showing a chopping wave amplitude control circuit 3c.
Figure 13:
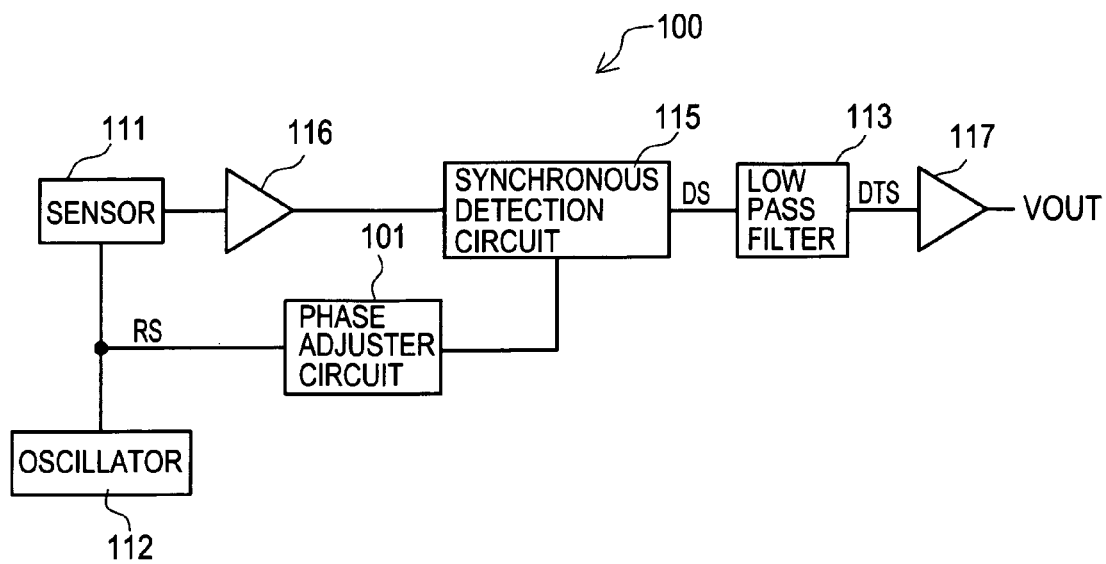
FIG. 13 is a circuit diagram showing a synchronous detection circuit 100 according to a related art.

In this embodiment, the synchronous detection circuit 10 always operates the chopping wave amplitude control circuit 3. However, the present invention is not limited to the above embodiment. As shown in FIG. 12, there may be provided a chopping wave amplitude control circuit 3c that operates only when the synchronous detection circuit 10 starts, or only when the environmental temperature exceeds a permissible temperature and changes. The chopping wave amplitude control circuit 3c includes a switch SW41 in addition to the peak hold circuit PH and the operational amplifier AMP1. The adjustment signal AS1 is held to the register REG through the switch SW41. The constant current source circuit CG2 variably controls the current I2 according to the output of the register REG. The control signal CS is inputted to the switch SW41.

A description will be given of a case in which the chopping wave amplitude control circuit 3c operates only when the synchronous detection circuit 10 starts. The control signal CS of the high level is inputted to the switch SW41 for a given period of time after the synchronous detection circuit 10 starts by a timer circuit not shown, and the switch SW41 is rendered conductive. Therefore, the adjustment signal AS1 is adjusted so that the amplitude value VAM of the chopping wave becomes a given value under the feedback control by the chopping wave amplitude control circuit 3c. After a given period of time sufficient to make the feedback control converge has elapsed, the control signal CS of the low level is outputted from the timer circuit not shown, and the switch SW41 is rendered non-conductive, to thereby stop the operation for the chopping wave amplitude control circuit 3c.

A description will be given of a case in which the chopping wave amplitude control circuit 3c operates only when the environmental temperature exceeds the permissible value and changes. The environmental temperature of the synchronous detection circuit 10 is monitored due to the temperature sensor not shown and the control circuit. In the case where the amount of change of the environmental temperature that is detected by the temperature sensor is within the permissible value, the switch SW41 is rendered non-conductive according to the control signal CS of the low level, and the chopping wave amplitude control circuit 3c comes to a stop state. Then, when the amount of change of the environmental temperature exceeds the permissible value, the control signal CS of the high level is outputted from the control circuit, and the switch SW41 is rendered conductive. Then, the value of the adjustment signal AS1 is adjusted such that the amplitude value VAM of the chopping wave becomes a given value under the feedback control by the chopping wave amplitude control circuit 3c. Then, after the given period of time has elapsed, the control signal CS is again set to the low level, the switch SW41 is rendered non-conductive, and the chopping wave amplitude control circuit 3c is rendered in the stop state. As a result, because an influence of the temperature change is removed, and the chopping wave amplitude control circuit 3c can be operated only as required, the power consumption can be reduced.

In the first embodiment, the value of the threshold value VCRF is set to an arbitrary value within a range of the amplitude value VAM of the chopping wave VC, thereby making it possible to adjust the phase shift amount OPD of the phase shift pulse string signal VPSOUT. However, the present invention is not limited to the above embodiment. It is needless to say that the value of the amplitude reference value VPAJ is set to an arbitrary value to adjust the amplitude value VAM, thereby making it possible to adjust the phase shift amount OPD.

Also, in the edge pulse generator circuit 5 according to the first embodiment, the edge pulse string signals VPEDG are generated in correspondence with the leading edge and the trailing edge of the pulse string signal VPSIN. However, the present invention is not limited to this embodiment. The edge pulse string signal VPEDG may be generated in correspondence with only any one of those edges. Also, the edge pulse string signal VPEDG may be generated in every given edge number. With this structure, there can be obtained the effect that the frequency fr of the pulse string signal VPSIN is divided, and it is possible to arbitrarily set the value of the phase shift amount.

Also, in this embodiment, the synchronous detection circuit was described. However, the minute signal amplifying method to which the present invention is applied is not limited to the synchronous detection. It is needless to say that there can be used a minute signal amplifying method using the pulse string signal VPSIN and the phase shift pulse string signal VPSOUT obtained by shifting the phase of the pulse string signal VPSIN. For example, the present invention can be applied to delay detection.

The pulse string signal VPSIN is an example of the reference signal, the phase shift pulse string signal VPOUT is an example of the phase shift reference signal, the constant current source circuit CG2 is an example of the first constant current source circuit, the edge pulse generator circuit 5 is an example of the edge detector circuit, the peak hold circuit PH and the bottom hold circuit BH are examples of the monitor circuit, and the register REG is an example of the holding circuit, respectively.

According to the phase adjuster circuit and the phase adjusting method of the present invention, even in the case where the frequency of the transmission carrier wave of the sensor signal fluctuates, it is possible to prevent the phase shift amount from fluctuating. Also, it is possible to more accurately finely adjust the phase.

What is claimed is:

1. A phase adjuster circuit in minute signal amplification using a reference signal and a phase shift reference signal having a given phase difference with respect to the reference signal, comprising:
    a chopping wave converter circuit that converts the reference signal into a chopping wave;
    a chopping wave amplitude control circuit to which the chopping wave is inputted and which outputs an adjustment signal corresponding to a difference of an amplitude value of the chopping wave with respect to an amplitude reference value to the chopping wave converter circuit; and
    a phase shift circuit that compares the inputted chopping wave with a given threshold value to output the phase shift reference signal,
    wherein the chopping wave converter circuit adjusts the amplitude value of the chopping wave according to the adjustment signal,
    wherein the chopping wave converter circuit comprises:
    a first constant current source circuit that variably controls the amount of current according to the adjustment signal;
    a capacitor element that is charged or discharged by the first constant current source circuit; and
    a switch circuit that controls charge and discharge operation with respect to the capacitor element according to the reference signal,
    wherein in the case where the amplitude value of the chopping wave crosses the amplitude reference value, the amount of current of the first constant current source circuit is decreased according to the adjustment signal, and
    wherein in the case where the amplitude value of the chopping wave does not cross the amplitude reference value, the amount of current of the first constant current source circuit is increased according to the adjustment signal.

2. The phase adjuster circuit according to claim 1, wherein the switch circuit is connected in series with the first constant current source circuit, connected in parallel to the capacitor element, rendered non-conductive at the time of charging the capacitor element, and rendered conductive at the time of discharging the capacitor element.

3. The phase adjuster circuit according to claim 2, further comprising a second constant current source circuit that is connected in series with the switch circuit and connected in parallel to the capacitor element.

4. The phase adjuster circuit according to claim 1, wherein the chopping wave converter circuit includes at least one edge detector circuit that detects a leading edge of the reference signal and/or a trailing edge of the reference signal, and
    wherein the switch circuit is subjected to conduction control according to the edge detecting operation of the edge detector circuit.

5. The phase adjuster circuit according to claim 4, further comprising:
    a first chopping wave converter circuit having a first edge detector circuit that detects the leading edge; and
    a second chopping wave converter circuit having a second edge detector circuit that detects the trailing edge.

6. The phase adjuster circuit according to claim 1, wherein the phase shift circuit includes a voltage comparator that has a first input terminal to which the threshold value is inputted and a second input terminal to which the chopping wave is inputted.

7. The phase adjuster circuit according to claim 6, wherein the chopping wave amplitude control circuit includes an averaging circuit that acquires an average value of the amplitude value of the chopping wave, and
    wherein the average value is inputted to the first input terminal of the voltage comparator.

8. A phase adjuster circuit in minute signal amplification using a reference signal and a phase shift reference signal having a given phase difference with respect to the reference signal, comprising:
    a chopping wave converter circuit that converts the reference signal into a chopping wave;
    a chopping wave amplitude control circuit to which the chopping wave is inputted and which outputs an adjustment signal corresponding to a difference of an amplitude value of the chopping wave with respect to an amplitude reference value to the chopping wave converter circuit; and
    a phase shift circuit that compares the inputted chopping wave with a given threshold value to output the phase shift reference signal,
    wherein the chopping wave converter circuit adjusts the amplitude value according to the adjustment signal,
    wherein the chopping wave amplitude control circuit comprises:
    at least one monitor circuit that monitors a voltage range of the amplitude value of the chopping wave; and
    an operational amplifier that is disposed in each of the monitor circuits, has a first input terminal to which an output of the monitor circuit is inputted, has a second input terminal to which the amplitude reference value is inputted, and outputs the adjustment signal.

9. The phase adjuster circuit according to claim 8, wherein the monitor circuit comprises a peak hold circuit, and the amplitude reference value is an upper limit value of the amplitude value of the chopping wave.

10. The phase adjuster circuit according to claim 8, wherein the monitor circuit comprises a bottom hold circuit, and the amplitude reference value is a lower limit value of the amplitude value of the chopping wave.

11. The phase adjuster circuit according to claim 8, wherein the monitor circuit comprises an averaging circuit, and the amplitude reference value is an average value of the amplitude value of the chopping wave.

12. The phase adjuster circuit according to claim 8, further comprising a holding circuit that holds the output signal of the operational amplifier and then outputs the output signal to the chopping wave converter circuit,
    wherein the chopping wave amplitude control circuit operates at the time of updating the output signal that is held in the holding circuit, and stops at the time of non-updating the output signal.

13. The phase adjuster circuit according to claim 8, wherein the phase shift circuit includes a voltage comparator that has a first input terminal to which the threshold value is inputted and a second input terminal to which the chopping wave is inputted.

14. The phase adjuster circuit according to claim 13, wherein the chopping wave amplitude control circuit includes an averaging circuit that acquires an average value of the amplitude value of the chopping wave, and
    wherein the average value is inputted to the first input terminal of the voltage comparator.

15. A phase adjusting method in minute signal amplification using a reference signal and a phase shift reference signal having a given phase difference with respect to the reference signal, comprising:

converting the reference signal into a chopping wave;
acquiring an adjustment signal according to a difference of an amplitude value of the chopping wave with respect to an amplitude reference value; and
comparing the inputted chopping wave with a given threshold value to output the phase shift reference signal,
wherein the amplitude value of the chopping wave is adjusted according to the adjustment signal when the reference signal is converted into the chopping wave,
wherein the phase adjusting method further comprises:
controlling variably an amount of current according to the adjustment signal;
charging or discharging a capacitor element with current; and
controlling a charge and discharge operation with respect to the capacitor element according to the reference signal,
wherein, in the case where the amplitude value of the chopping wave crosses the amplitude reference value, the amount of current is decreased according to the adjustment signal, and
wherein, in the case where the amplitude value of the chopping wave does not cross the amplitude reference value, the amount of current is increased according to the adjustment signal.

16. A phase adjusting method in minute signal amplification using a reference signal and a phase shift reference signal having a given phase difference with respect to the reference signal, comprising:

converting the reference signal into a chopping wave;
acquiring an adjustment signal according to a difference of an amplitude value of the chopping wave with respect to an amplitude reference value;
comparing the inputted chopping wave with a given threshold value to output the phase shift reference signal;
wherein the amplitude value of the chopping wave is adjusted according to the adjustment signal when the reference signal is converted into the chopping wave,
wherein the phase adjusting method further comprises:
monitoring a voltage range of the amplitude value of the chopping wave; and
outputting the adjustment signal according to an amplification result of the amplitude reference value and the voltage range of the amplitude value.

* * * * *